US011868685B2

(12) United States Patent
Keferstein

(10) Patent No.: US 11,868,685 B2
(45) Date of Patent: Jan. 9, 2024

(54) GENERATING A DIGITAL TWIN, METHOD, SYSTEM, COMPUTER PROGRAM PRODUCT

(71) Applicant: Siemens Industry Software NV, Leuven (BE)

(72) Inventor: Lutz Keferstein, Dorsten (DE)

(73) Assignee: SIEMENS INDUSTRY SOFTWARE NV, Leuven (BE)

( * ) Notice: Subject to any disclaimer, the term of this patent is extended or adjusted under 35 U.S.C. 154(b) by 0 days.

(21) Appl. No.: 18/037,607

(22) PCT Filed: Oct. 21, 2021

(86) PCT No.: PCT/EP2021/079198
§ 371 (c)(1),
(2) Date: May 18, 2023

(87) PCT Pub. No.: WO2022/106142
PCT Pub. Date: May 27, 2022

(65) Prior Publication Data
US 2023/0325553 A1    Oct. 12, 2023

(30) Foreign Application Priority Data
Nov. 20, 2020  (EP) .................................. 20208992

(51) Int. Cl.
*G06F 30/20* (2020.01)
(52) U.S. Cl.
CPC .................................... *G06F 30/20* (2020.01)
(58) Field of Classification Search
CPC ........................................................ G06F 30/20
See application file for complete search history.

(56) References Cited

U.S. PATENT DOCUMENTS

2018/0137219 A1* 5/2018 Goldfarb ................. G06N 3/126
2018/0202431 A1* 7/2018 Freund ..................... F04B 49/20
(Continued)

FOREIGN PATENT DOCUMENTS

CN    111880497 A    11/2020
WO    03013102 A1    2/2003
(Continued)

OTHER PUBLICATIONS

International Preliminary Report for International Application No. PCT/EP2021/079198 dated Mar. 2, 2023.

*Primary Examiner* — Chuen-Meei Gan
(74) *Attorney, Agent, or Firm* — Lempia Summerfield Katz LLC

(57) ABSTRACT

A computer-implemented method of generating a digital twin. To improve the efficiency of handling a digital twin the method includes the steps of: providing a digital twin modular system, the digital twin modular system being characterized by digital twin modules being adapted or being adaptable to digital twin features, the digital twin features relating to at least one of calculation properties, scope of simulation, model architecture, communication safety, accessibility, data storage, encryption functions, resource allocation, hardware requirements, providing a tuning module, wherein the tuning module includes a tuning module parameter set, wherein the tuning module parameter-set includes tuning module parameters respectively corresponding to at least one digital twin feature generating a digital twin by using the tuning module performing the steps of selecting, configuring, and combining digital twin modules of the digital twin modular system according to the tuning module parameters.

13 Claims, 3 Drawing Sheets

(56) References Cited

U.S. PATENT DOCUMENTS

2019/0173109 A1   6/2019  Wang
2020/0274768 A1   8/2020  Böhm
2021/0132583 A1*  5/2021  Shu .................. G05B 19/41805

FOREIGN PATENT DOCUMENTS

| WO | 2018111368 A1 | 6/2018 |
| WO | 2020190272 A1 | 9/2020 |
| WO | 2020231428 A1 | 11/2020 |

* cited by examiner

GENERATING A DIGITAL TWIN, METHOD, SYSTEM, COMPUTER PROGRAM PRODUCT

CROSS REFERENCE TO RELATED APPLICATIONS

This present patent document is a § 371 nationalization of PCT Application Serial Number PCT/EP2021/079198, filed Oct. 21, 2021, designating the United States which is hereby incorporated in its entirety by reference. This patent document also claims the benefit of EP20208992.6 filed on Nov. 20, 2020, which is hereby incorporated in its entirety by reference.

FIELD

Embodiments relate to a computer-implemented method of generating a digital twin including specific features relating to calculation properties, scope of simulation, model architecture, communication safety, accessibility, data storage, encryption functions, resource allocation or hardware requirements.

BACKGROUND

In a cyber-physical system, the digital twin concept includes three elements: The physical product, the digital or virtual product, and connections between the two products. The digital or virtual product is hereinafter considered the digital twin. The connections between the physical product and the digital twin may be several sensors and data that flows from the physical product to the digital twin and information that is available from the digital twin to the physical environment.

From WO 2020/190272 A1 a method of modularly generating a digital twin is known. Documents WO 2018/111368 A1, CN 111 880 497 A, US 2020/274768 A1 respectively disclose additional technological background information. From US 2019/173109 A1 a digital twin-based fuel cell management system is known including a separate digital twin for commissioning and for operation.

Complex products or products planned to be part of a more complex system—are at present partly combined with a digital twin and may in future require more often a digital twin to be offered with the product. If the technology to be sold is not provided with a digital twin the potential customer may not be able to simulate the correct operation of the overall system in advance to be sure that everything works together properly. Often the provision of the digital twin—in advance—may be the default door-opener to a customer for any selling activity.

Providing a digital twin requires large investments in research, development, and implementation. Due to the high costs, most products are not offered in combination with a digital twin. Today a digital twin is often made as an individual work of software and in case of changes the amendments in the software code require additional investment respectively cause many hours of work, even for minor adjustments.

One significant risk arising from such a trend is that the digital twin at least partly enables copying of the product to be sold—this relates to the digital twin itself but also to specific hardware to be simulated with the digital twin. A third party might analyze the digital twin—which may have been provided for sale purpose—and finally might be able to at least partly rebuild the product on offer. Additional information might be available from other sources to enable a full copy of the product. All information might be combined such that anybody skilled in such practices might be able to save the R&D effort and offer a product with basically identical properties.

Digital twin types according to a current ruling opinion listed in a time related order are: the 'digital twin prototype' consisting of designs, analyses, and processes for designing a physical product, the 'digital twin instance' is the digital twin of each individual instance of the manufactured product, and the digital twin aggregate (DTA) is an aggregation of digital twins relating to operational products for interrogation about the physical product, prognostics, and learning.

Embodiments relate to all these types to improve easy reusability of the single modules in different simulation environments. Embodiments also relate to digital twins as Functional Mock-up Interfaces (FMU or FMI; defines a standardized interface to be used in computer simulations to develop complex cyber-physical systems), executable digital twins or similar concepts.

Digital twin may be provided compliant to a specific technical standard enabling effortless usage in a simulation environment and cooperating with other digital twins of other components maybe provided by different companies.

Embodiments improve reusability of digital twins or at least modules of such. For reaching this aim the embodiments propose to improve adaptability respectively the flexibility of the digital twin respectively the generation of a digital twin.

BRIEF SUMMARY AND DESCRIPTION

The scope of the embodiments is defined solely by the appended claims and is not affected to any degree by the statements within this summary. The present embodiments may obviate one or more of the drawbacks or limitations in the related art.

To improve the flexibility of the digital twin concept and enable easy reuse of digital twins in different environments embodiments include a method of the incipiently mentioned type including the additional steps of: providing a digital twin modular system, the digital-twin modular system being characterized by digital-twin-modules being adapted or being adaptable to digital-twin-features, the digital-twin-features relating to at least one of calculation properties, scope of simulation, model architecture, communication safety, accessibility, data storage, encryption functions, resource allocation, hardware requirements, providing a tuning module, wherein the tuning module includes a tuning module parameter-set, wherein the tuning module parameter-set includes tuning module parameters respectively corresponding to at least one digital twin feature, generating a digital twin by using the tuning module performing the steps of selecting, configuring and combining digital-twin-modules of the digital twin modular system according to the tuning module parameters.

The digital-twin-features relating to at least one of calculation properties, scope of simulation, model architecture, communication safety, accessibility, data storage, encryption functions, resource allocation, hardware requirements are essential features of the digital twin relating to the destination of operation respectively the environment for which the digital twin is designed for. In some environments communication safety may be very important, for example communication through public networks in combination with critical infrastructure or military technology. In other environments communication safety may be of minor importance, for example, if the communication is done on the closed network environments without galvanic/physical connection to the public network.

The digital-twin-features mentioned above may relate partly to identical digital-twin-parameters and are interconnected or even dependent on each other. For example, calculation speed may be related to calculation behavior and digital-twin-hardware requirements.

For the provider's in-house simulation it may be necessary to have a very fast digital twin to enable full-scale simulation of complex systems. It may be desirable to not enable this full-scale simulation to every customer or to even make it available to everybody by download in the Internet. It may even be possible to provide an artificial delay in the digital twin to restrict specific usage.

The required computer performance is related to digital twin-hardware requirements and calculation behavior. The accuracy of calculation is related to calculation behavior, digital twin-hardware requirement. The risk of being copied respectively the damage potential of such copying increases with the accuracy of implementation of details of the hardware in the digital twin. Several properties of a digital twin relate to this safety matter respectively to the risk of being copied respectively losing secret intellectual property. A customer may not have the same accuracy requirements as the provider of the hardware to be simulated. Also, accuracy may consume too much calculation performance and therefore customers need a faster but less accurate version of the digital twin.

The operating range of the digital twin is related to a scope of simulation. The underlying physical or empirical model of the digital twin is related to a model architecture, calculation behavior, digital twin-hardware requirement. It may be reasonable to restrict the operating range of a digital twin to avoid too much complexity and to avoid operation of that digital twin in an operating range which is not recommended and might consume too much lifetime of the hardware. For a provider it may be very important to restrict operating range settings to avoid the usage of the digital twin provided to simulate any third-party products which have different operating ranges.

The complexity of the physics considered respectively neglecting of effects is related to a model architecture, calculation behavior and digital twin-hardware requirement. It may be reasonable to restrict or to limit or to simplify the physics being implemented in the digital twin for specific simulation purposes. For example, it may not be necessary to consider the specific temperature distribution in the hardware in order to make a simulation of moderate accuracy. On the other hand, it may be necessary to have the temperature distribution simulated for R&D purposes.

The number of input or output parameters, respectively the selection of input or output parameters relates to the scope of simulation, the calculation behavior, and the digital twin-hardware requirements.

Also important are safety features in general, for example safety features against hacking attacks or safety features against manipulation of digital twin-tuning parameters.

For the digital twin being operated to simulate a technically complex environment—for example a nuclear power plant, it may be necessary to implement safety features (encrypted communication, firewalls . . . ) which protect— maybe predominantly or exclusively protect—the digital twin from being manipulated. It may be necessary to avoid a digital twin manipulation since a deviation of the digital twin behavior and the real hardware behavior may cause an emergency shutdown of the plant or any other system respectively critical system. This would put the digital twin concept in doubt if only the digital twin needs to be manipulated to cause problems while the hardware would be in perfect order. To avoid unexpected development, it may be reasonable under high safety requirements to have a second virtual representation of the real system—a second digital twin of the real system may be provided next to the 'normal' digital twin.

Further, when providing a digital twin to a third party, for example a customer it might not be advisable to make all functions and the full performance of the digital twin available. On the other hand, it might be too much effort to generate separate digital twins for internal usage and digital twins for external usage like download for everybody, customer information, sale activity, customer simulation and other purposes.

Embodiments solve this dilemma by providing the tuning module enabling the generation of the digital twin performing the steps of selecting, configuring, and combining digital-twin-modules.

One embodiment provides a method for critical systems with the additional steps of: providing next to a first digital twin a second digital twin both being a virtual representation of the identical system, operating the second digital twin in parallel to the first digital twin, receiving a specifically classified or predefined parameter to be received by the digital twins submitting that parameter to only the first digital twin while delaying the submission of that parameter for the second digital twin changing the behavior of the digital twin only one of the two digital twins will receive this classified input—at least in first instance—while the other continues without that input for a predefined time interval, comparing the behavior during the time interval, isolating the second digital twin from receiving the parameter if the first digital twin behaves in a significantly unexpected way when compared to reference data comparing both digital twins with the corresponding hardware behavior to decide which digital twin behaves more like the hardware and which may be miss-functional.

One embodiment of the method for critical systems may include the additional steps of: identifying the correct operating digital twin, synchronizing both digital twins to the correct operating digital twin, optionally: compensating any delay of the digital twin (may be caused by delaying the input) by adjusting the calculation speed for as long as necessary.

Herein 'synchronizing both digital twins to the correct operating digital twin' means that the correct operating digital twin is the reference for both digital twins and after synchronizing both digital twins both have the configuration of the reference digital twin.

Such safety features may be beneficial for critical systems but may be not necessary for every system's virtual representation or digital twin or for any sale version of the digital twin which may be only intended to promote the hardware or for any R&D tool as a digital twin.

The dispersedness of a digital twin, respectively the cloudification or the distribution of the system relates to communication, data storage and resource allocation. Possibilities to access the system remotely respectively remote accessibility relates to access in general, safety properties and communication. The remote accessibility of the digital twin may be an application for the digital twin tuning module. This accessibility might relate only to tuning possibilities from remote but could also include taking influence on the digital twin operation and could also relate to data monitoring of input data and output data of the digital twin which might also be useful for machine learning of some neural network with regard to digital twin behavior.

Protected communication or interaction with the digital twin relates to communication and encrypted communication. Protecting the communication or interaction of the digital twin with external modules relates to remote access. It may be useful to deactivate this kind of protection to increase performance of the digital twin under conditions of inherent safety. This might be possible in an isolated system without any access from external.

Gradual monitoring relates to the possibility of a provider of the digital twin to monitor the activity of the user. This monitoring may be restricted to the time of usage and/or to repetition cycles of solvers and/or to the number of outputs generated are to any other countable item related to the usage of the digital twin. The monitoring activity can be expanded to observe every input and every output and every intermediate result. The gradual monitoring parameter enables to adjust the monitoring activity of the provider relating to the usage of the digital twin, wherein the respective monitored item may be defined as well as the monitoring extent.

Similarly, the share of information relates to access safety, security, and communication properties of the system. Sharing of information respectively data monitoring may be done defined by a tuning module parameter for example by the provider of the digital twin. If the digital twin is provided cost-free e.g. to make a quick simulation (e.g. customer checks if the hardware fits into a complex system) it might be possible that the provider reserves the right to monitor this kind of operation and that the provider has access to the input/output of the digital twin. If the customer pays for the hardware including the digital twin this option may be deactivated according to the customer's requirements to a certain extend up to total independency of the user.

The digital twin might be operated on only one CPU or might have a higher degree of distribution respectively cloudification. The tuning module may enable during a preparation phase or even during operation to change the settings of distribution of the respective modules of the digital twin. This may happen motivated by allocation of calculation resources on different computers and may be in the cloud may be motivated by the desire of the provider to control the digital twin users. The distribution of modules of the digital twin may enable the provider to keep modules of specific secrecy on in-house machines, only.

According to an embodiment, the tuning module may be provided as a module of the digital twin and may be accessed by a digital twin tuning module interface. This embodiment enables a quick and easy adjustment of the digital twin features. The tuning module access may be protected at least by a password authentication.

An alternative possibility is to have the tuning module and maybe the tuning module interface being a separate module from the digital twin. This embodiment improves the safety of the digital twin against manipulation and possible loss of intellectual property or secrets which may be recognizable from the unprotected digital twin.

According to an embodiment of the method, the tuning module of the digital twin includes access restrictions like a password protection permitting specific access only to identified users. The tuning module of the digital twin may be password protected and/or may be protected differently against manipulation. The tuning module may be a separate module or may be part of the digital twin enabling tuning without an additional tuning module. In any of these variants the digital twin and the tuning module may be well protected. The access restriction may be according to known standards.

According to another embodiment of the method, the digital twin includes at least one input interface and at least one output interface, wherein the digital twin includes at least one functional module generating output from input. The input interface may serve to receive data from sending modules. Respectively the output interface may serve to send data to receiving modules. Input to the input interface may also be provided by the user respectively the input interface may be designed as a user interface. The functional module generates at least one output from the at least one input which may include the application of algorithms, recursive functions, neural networks, or other functional modules or combinations of them.

According to another embodiment of the method, the tuning module includes an information interface for providing information to a user, the information including an actual setpoint of at least two tuning module parameters, the method including: providing information to a user by the information interface, the information including the actual setpoint of at least two tuning module parameters.

Such information displayed through the information interface to the user may be at least one adjustable first tuning parameter—being fixed after inputted by the user—and a second tuning parameter—being defined as free respectively adjustable by a prediction module of the tuning module—depending on the first tuning parameter and its tendency of change second tuning parameter when changing the first tuning parameter or even a predicted value of the second tuning parameter. Such prediction module may work as described below.

According to another embodiment of the method, the tuning module includes a prediction module the method including: predicting at least a tendency of change of at least a second tuning module parameter when changing at least a first tuning module parameter, providing to the information interface at least the tendency of change as a tendency of change indicator of at least the second tuning module parameter when changing at least the first tuning module parameter.

Such prediction module may use at least one algorithm to derive predictive values from known values respectively parameters. Such algorithm may include a neural network being trained by machine learning steps and which may be permanently trained during ongoing operations. The neural network may be trained by comparing the predicted values with the results the digital twin achieves during operation. One good example of the possibility to adjust the fixed tuning parameter to certain value may be the calculation accuracy of the digital twin relating to certain output parameters, which has a strong influence on the calculation speed. The prediction module may predict the calculation speed of the digital twin when the user fixes—maybe by way of a user input interface—the calculation accuracy to a specific requirement. Additional aspects are described below.

The method may include the additional steps of assigning some of the tuning module parameters to a group of fixed tuning module parameters and assigning others of the tuning module parameters to a group of free tuning module parameters, and tuning module parameters, wherein the prediction module is designed to derive from the fixed tuning module parameters an estimation of the free tuning module parameters.

The method may include the additional steps of: receiving interface input through a user interface including the assignment of at least two tuning module parameters to one of the classifiers: fixed tuning module parameter, free tuning module parameter, determining tuning module parameter assigned as free tuning module parameter, generating a digital twin by using the tuning module performing the steps of selecting, configuring, and combining digital-twin-modules of the digital twin modular system according to the tuning module parameters.

Embodiments also include a system for performing the method according to at least some of the preceding aspects.

The system includes a digital twin modular system, the digital-twin modular system including digital-twin-modules that are configured to digital-twin-features relating to calculation properties, scope of simulation, model architecture, communication safety, accessibility, data storage, encryption functions, resource allocation, and hardware requirements.

Further the system includes a tuning module. The tuning module includes a tuning module parameter-set. The tuning module parameter-set includes tuning module parameters respectively corresponding to at least one digital twin feature, wherein the tuning module is prepared to generate a digital twin by performing the steps of selecting, configuring, and combining digital-twin-modules of the digital twin modular system according to the tuning module parameters.

According to another embodiment of the system, the digital twin-features are at least one of: calculation speed, required computer performance, accuracy of calculation, hardware operating range of the digital twin, underlying physical model respectively complexity of the physics considered, number of input and output parameter respectively selection of input parameters and output parameters, safety features against hacking attacks, safety features against manipulation of digital twin-tuning parameters, Dispersedness/Cloudification/Distributed system Remote accessibility Protected communication/interaction Gradual monitoring/gradual share of information.

According to another embodiment of the system, the tuning module includes a prediction module. The tuning module includes an information interface for providing information to a user, wherein the information interface is prepared to provide at least a tendency of change indicator of at least a second tuning module parameter when changing at least a first tuning module parameter to the user.

According to another embodiment of the system, the tuning module parameter-set includes fixed tuning module parameters and free tuning module parameters. The prediction module is configured to derive from the fixed tuning module parameters an estimation of at least some of the free tuning module parameter assignment.

According to another embodiment of the system, the user interface input includes an assignment of at least two tuning module parameters to one of the classifiers: fixed tuning module parameters, in other words: no changes to tuning module parameter, free tuning module parameters, in other words: changes to tuning module parameter possible during prediction of free parameters by prediction module and generation of digital twin is done accordingly on basis of adjusted free tuning module parameter set.

In such embodiment the tuning module may generate a digital twin including digital twin features with at least some of the tuning module parameters classified as free tuning module parameters changed and all of the tuning module parameter classified as fixed tuning module parameters unchanged when compared to the tuning module parameter's setpoints provided in the tuning module before generation of the digital twin.

According to another embodiment of the system, the prediction module may include a neural network trained to derive from the given tuning module parameters an estimation of the free tuning module parameters.

Embodiments include a computer-readable medium encoded with executable instructions, that when executed, cause a system as described above, for example a computer system to carry out a method or one of its embodiments as described herein.

BRIEF DESCRIPTION OF THE DRAWINGS

The illustration in the drawings is in schematic form. It is noted that in different figures, similar or identical elements may be provided with the same reference signs.

DETAILED DESCRIPTION

Figure 1:
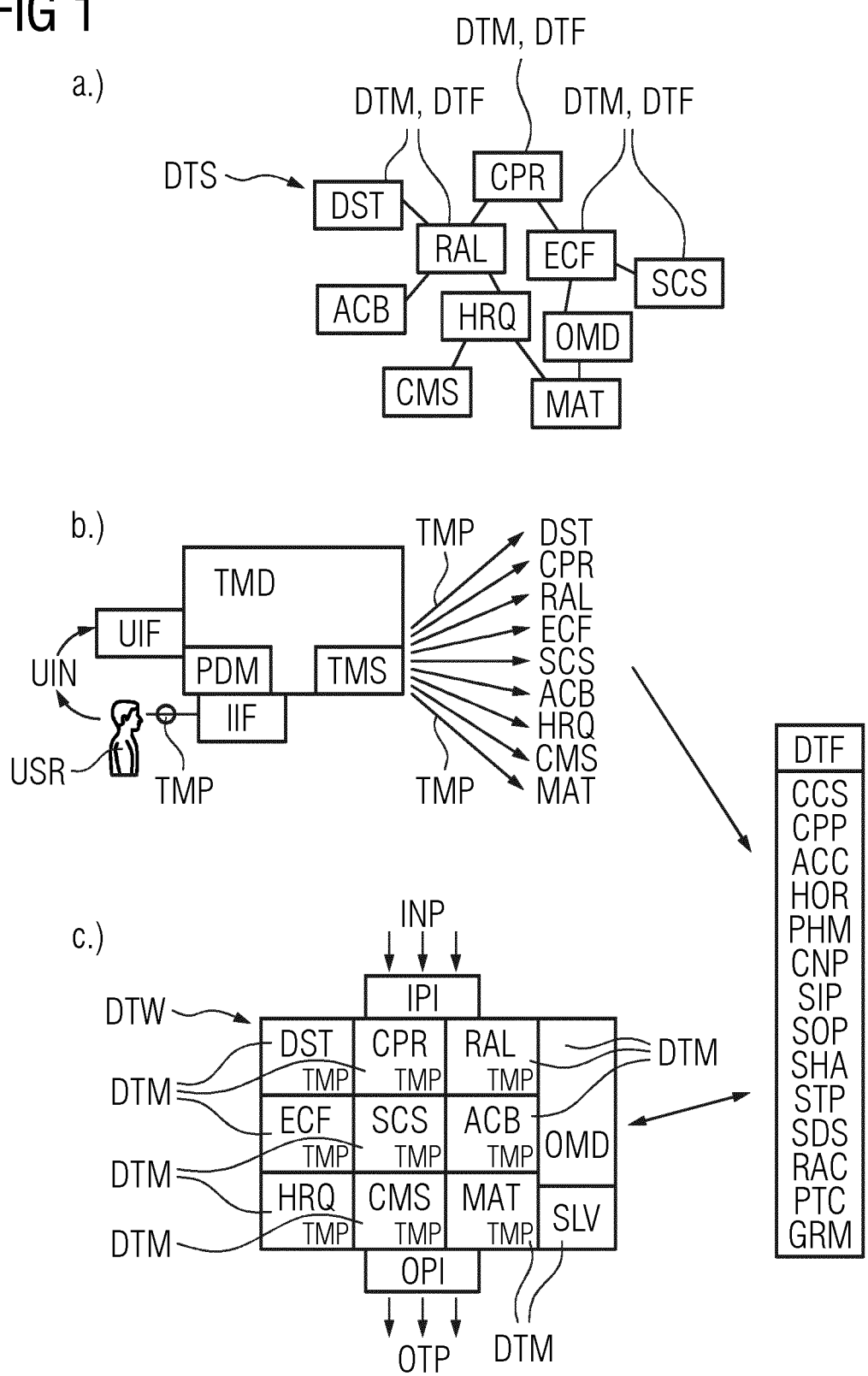
FIG. 1 depicts a flow diagram of a method according to an embodiment.
Figure 2:
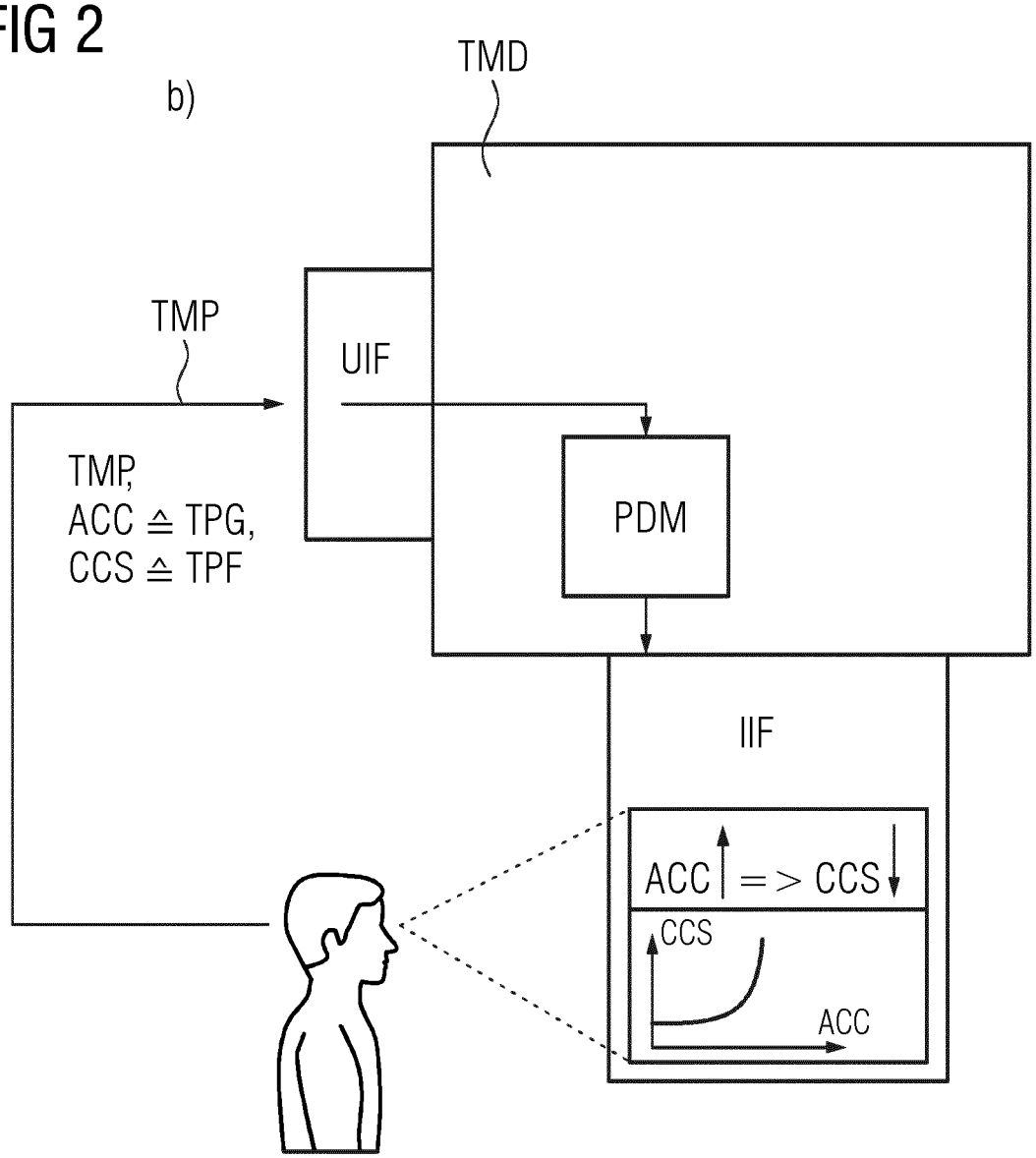
FIG. 2 depicts a schematic diagram illustrating optional details of a system including the tuning module according to an embodiment.

FIG. 1 depicts a simplified flow diagram illustrating a computer-implemented method and a system SYS for performing the method of generating a digital twin DTW. The following steps are shown simplified in FIG. 1. Herein step a. relates to providing a digital twin modular system DTS. The digital-twin modular system DTS is characterized by digital-twin-modules DTM being adapted or being adaptable to digital-twin-features DTF. The digital-twin-features DTF relating to at least one of calculation properties CPR, scope of simulation SCS, model architecture MAT, communication safety CMS, accessibility ACB, data storage DST, encryption functions ECF, resource allocation RAL, hardware requirements HRQ.

Further the method includes a step b. relating to providing a tuning module TMD. The tuning module TMD includes a tuning module parameter-set TMS. The tuning module parameter-set TMS includes tuning module parameters TMP respectively corresponding to at least one digital twin feature DTF.

Further the method includes a step c. relating to generation of a digital twin DTW by using the tuning module TMD performing the steps of selecting, configuring, and combining digital-twin-modules DTM of the digital twin modular system DTS according to the tuning module parameters TMP.

As shown in FIG. 1 the digital twin DTW may include at least one input interface IPI and at least one output interface OPI. The digital twin DTW includes at least one functional module SLV generating output OTP from input INP. The digital-twin-features DTF are part of at least one of the digital-twin-feature-groups DFG: calculation properties CPR, scope of simulation SCS, model architecture MAT, communication safety CMS, accessibility ACB, data storage DST, encryption functions ECF, resource allocation RAL and hardware requirements HRQ. The digital-twin-features DTF are at least one of: calculation speed CCS required computer performance CPP accuracy of calculation ACC, hardware operating range of the digital twin HOR underlying physical/empirical model PHM, complexity of the physics considered/neglecting of effects CNP, number of input parameters and/or selection of input parameters SIP, number of output parameter and/or selection of output parameters SOP, safety features against hacking attacks SHA, safety features against manipulation of digital twin-tuning parameters STP, dispersedness/cloudification/distributed system DSD, remote accessibility RAC, protected communication and/or interaction PTC, gradual monitoring and/or gradual share of information GRM.

To enable a user to interact with the method the tuning module TMD may include an information interface IIF for providing information to a user USR, the information including an actual setpoint of at least two tuning module parameters TMP. Accordingly, the method may include the additional steps: providing information to a user by the information interface IIF. The information may include the actual setpoint of at least two tuning module parameters TMP.

To enable a better and reasonable input of tuning parameters to be fixed the tuning module TMD may include a prediction module PDM the method including: predicting at least a tendency of change of at least a second tuning module parameter TMP when changing at least a first tuning module parameter TMP, providing to the information interface IIF at least the tendency of change as a tendency of change indicator TCI of at least the second tuning module parameter TMP when changing at least the first tuning module parameter TMP. A user may set the parameters according to predicted values of other parameters to obtain the best fitting parametrization of the digital twin features as a basis for generating the digital twin DTW.

To make the process transparent to the user USR the method may further include the steps of: assigning some of the tuning module parameters TMP to a group of fixed tuning module parameters TPG and assigning others of the tuning module parameters TMP to a group of free tuning module parameters TPF, and tuning module parameters TPF. The prediction module PDM is configured to derive from the fixed tuning module parameters TMG an estimation of the free tuning module parameters TPF.

The user may enter through a user interface UIF interface input UIN including the assignment of at least two tuning module parameters TMP to one of the classifiers: fixed tuning module parameter TPG, free tuning module parameter TPF.

Subsequently tuning module parameter TPG may be determined tuning module parameters TPG for the tuning module parameters TPF being assigned as free tuning module parameters TPF, generating a digital twin DTW by using the tuning module TMD. On such basis, the steps of selecting, configuring, and combining digital-twin-modules DTM of the digital twin modular system DTS may be performed according to the tuning module parameters TMP.

The method may be stored on a computer-readable medium. The computer-readable medium may be encoded with executable instructions, that when executed, cause a system SYS, for example a computer system to carry out the method or at least one of its embodiments.

Figure 3:
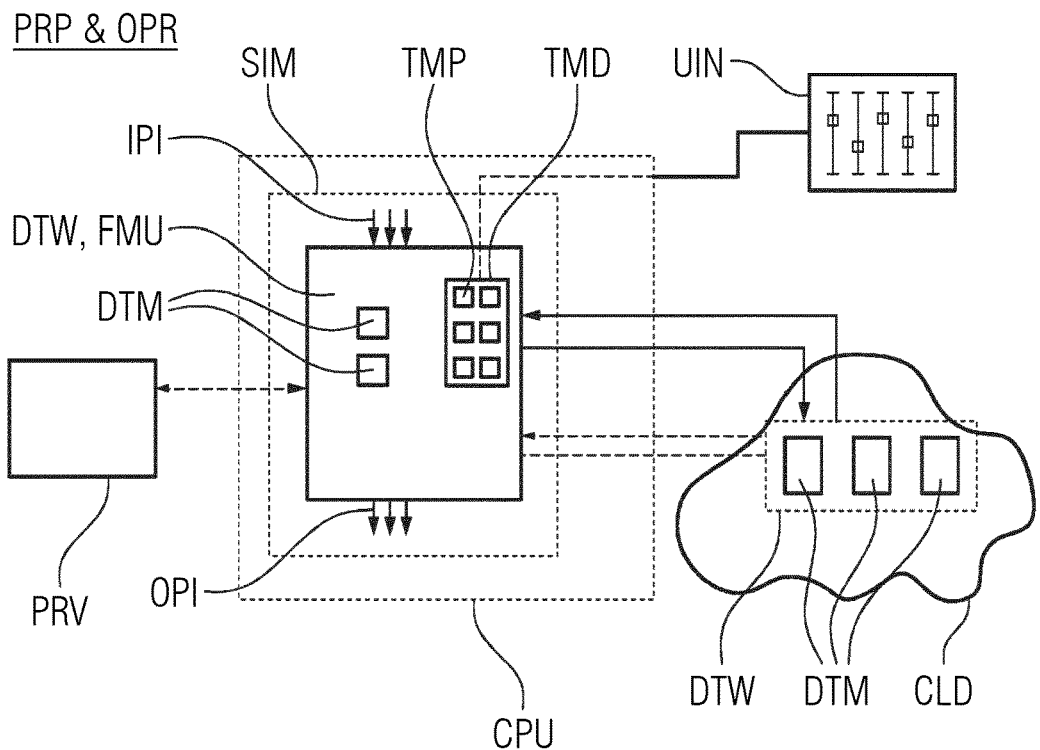
FIGS. 3 and 4 depict a schematic diagram of an embodiment including possible details of the tuning module.
Figure 4:
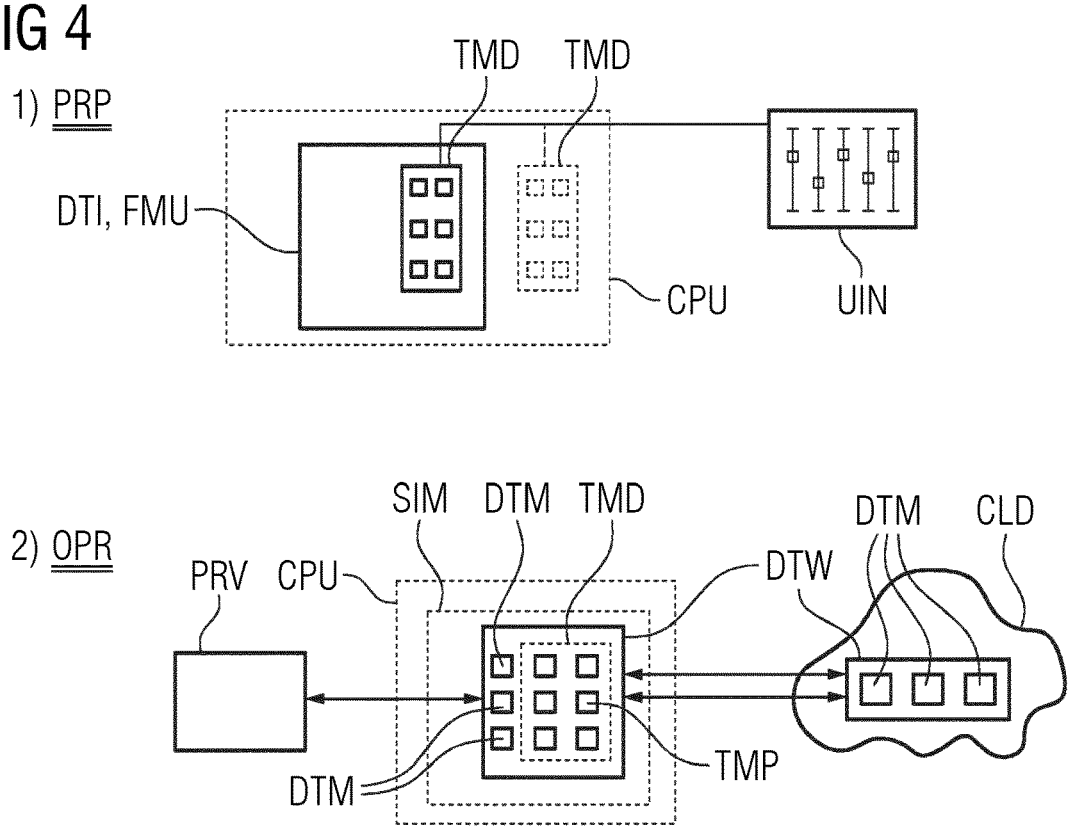

FIGS. 3 and 4 depict schematically possible implementations of the tuning module for a digital twin.

FIG. 3 depicts the digital twin that may be provided as a functional mockup unit FMU being part of the simulation SIM running on a computer CPU. The tuning module TMD may be part of the digital twin containing several tuning module parameters TMP of a tuning module parameter-set TMS respectively corresponding to at least one digital twin feature DTF. A tuning module user interface UIN enables taking influence on the tuning module parameters TMP by user interface input UIN to change the digital twin behavior. The tuning module parameter-set TMS respectively the tuning module parameters TMP may be in general of gradual (e.g. all values possible) or binary (e.g. yes/no or 0/1 or true/false . . . ) nature. Depending on the tuning module parameter TMP settings the digital twin is generated with specific features or properties as listed and explained above.

The digital twin DT may be distributed (arranged distributed or located) over several instances and e.g. may include communication with a cloud CLD to a certain degree specified by one of the tuning module parameters TMP. The settings of the digital twin by the tuning module TMD may influence the input INP and output OPT of the digital twin DTW. Further, the exchange of data or information between the digital twin and the provider PRV may be defined using the tuning module parameters TMP.

FIG. 4 depicts an embodiment where the digital twin tuning respectively the preparation PRP might be done in a separate step 1) before the digital twin operation OPR is performed in the second step 2). The preparation phase depicts also that the tuning module may be a module of the digital twin DTW or may be an external module which may be operated on the same central processing unit CPU and is configured by the tuning module TMD on the basis of user input UIN. As shown in step 2 the operation OPR takes place without the tuning module TMD being configured by the tuning module interface. According to this embodiment during the operation OPR the tuning module TMD is not part of the digital twin DTW.

It should be noted that the use of "a" or "an" throughout this application does not exclude a plurality, and "including" does not exclude other steps or elements. Also, elements described in association with different embodiments may be combined. It should also be noted that reference signs in the claims should not be construed as limiting the scope of the claims.

It is to be understood that the elements and features recited in the appended claims may be combined in different ways to produce new claims that likewise fall within the scope of the present embodiments. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present embodiments have been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer implemented method of generating a digital twin comprising:
providing a digital twin modular system, wherein the digital twin modular system comprises digital-twin-modules configured for to digital twin features, wherein the digital twin features are related to at least one of: calculation properties, scope of simulation, model architecture, communication safety, accessibility, data storage, encryption functions, resource allocation, hardware requirements;
providing a tuning module, wherein the tuning module comprises a tuning module parameter-set, wherein the tuning module parameter-set comprises tuning module parameters respectively corresponding to at least one of the digital twin features;

receiving a user's configuration through a user interface, the user's configuration comprising an assignment of some of the tuning module parameters to a group of fixed tuning module parameters and an assignment of others of the tuning module parameters to a group of free tuning module parameters;

determining tuning module parameters for the free tuning module parameters; and generating a digital twin by selecting, configuring, and combining digital-twin-modules of the digital twin modular system based at least in part on the tuning module parameters and user's configuration to increase adaptability of the digital twin in different environments.

2. The computed implemented method of claim 1, wherein the digital twin comprises at least one input interface and at least one output interface, wherein the digital twin comprises at least one functional module generating output from input.

3. The computed implemented method of claim 1, wherein the digital twin features are part of at least one of the digital win feature-groups including: calculation properties, scope of simulation, model architecture, communication safety, accessibility, data storage, encryption functions, resource allocation, or hardware requirements.

4. The computed implemented method of claim 3, wherein the digital twin features are at least one of: calculation speed, required computer performance, accuracy of calculation, hardware operating range of the digital twin, underlying physical/empirical model, complexity of physics considered /neglecting of effects, number of input parameters and/or selection of input parameters, number of output parameter and/or selection of output parameters, safety features against hacking attacks, safety features against manipulation of digital twin-tuning parameters, Dispersedness/Cloudification/Distributed system, Remote accessibility, Protected communication and/or interaction, or Gradual monitoring and/or gradual share of information.

5. The computed implemented method of claim 1, wherein the tuning module comprises an information interface for providing information to a user, the information comprising an actual setpoint of at least two tuning module parameters, the computer implemented method further comprising: providing information to a user by the information interface, the information comprising the actual setpoint of at least two tuning module parameters.

6. The computed implemented method of claim 5, wherein the tuning module comprises a prediction module, and wherein the computer implemented method further comprises:

predicting at least a tendency of change of at least a second tuning module parameter when changing at least a first tuning module parameter; and providing to the information interface at least the tendency of change as a tendency of change indicator of at least the second tuning module parameter when changing at least the first tuning module parameter.

7. The computed implemented method of claim 6:
wherein the prediction module is configured to derive from the fixed tuning module parameters an estimation of the free tuning module parameters.

8. A system comprising:
a digital twin modular system, wherein the digital twin modular system comprises digital-twin-modules configured for digital twin features relating to calculation properties, scope of simulation, model architecture, communication safety, accessibility, data storage, encryption functions, resource allocation, or hardware requirements;

a user interface configured to receive a user's configuration comprising an assignment of at least two tuning module parameters to one of classifiers including fixed tuning module parameters or free tuning module parameters, wherein the tuning module parameters are determined for tuning module parameters assigned as free tuning module parameters; and a tuning module comprising a tuning module parameter-set, wherein the tuning module parameter-set comprises tuning module parameters respectively corresponding to at least one digital twin feature, wherein the tuning module is configured to generate a digital twin by selecting, configuring, and combining digital-twin-modules of the-digital twin modular system according to the tuning module parameters and user's configuration to increase adaptability of the digital twin in different environments.

9. The system of claim 8, wherein the digital twin features are at least one of: calculation speed, required computer performance, accuracy of calculation, hardware operating range of the digital twin, underlying physical/empirical model, complexity of physics considered/neglecting of effects, number of input parameters and/or selection of input parameters, number of output parameter and/or selection of output parameters, safety features against hacking attacks, safety features against manipulation of digital twin-tuning parameters, Dispersedness/Cloudification/Distributed system, Remote accessibility, Protected communication and/or interaction, or Gradual monitoring and/or gradual share of information.

10. The system of claim 8, wherein the tuning module comprises a prediction module, wherein the tuning module comprises an information interface for providing information to a user, wherein the information interface is prepared to provide at least a tendency of change indicator of at least a second tuning module parameter when changing at least a first tuning module parameter to the user.

11. The system of claim 10, wherein the prediction module is configured to derive from the fixed tuning module parameters an estimation of at least some of the free tuning module parameter assignment.

12. The system of claim 11, wherein the prediction module comprises a neural network trained to derive from given tuning module parameters an estimation of the free tuning module parameters.

13. A non-transitory computer-readable medium encoded with executable instructions stored thereon, that when executed, cause at least one processor to:

provide a digital twin modular system, wherein the digital twin modular system comprises digital-twin-modules configured for to digital twin features, wherein the digital twin features are related to at least one of: calculation properties, scope of simulation, model architecture, communication safety, accessibility, data storage, encryption functions, resource allocation, hardware requirements;

provide a tuning module, wherein the tuning module comprises a tuning module parameter-set, wherein the tuning module parameter-set comprises tuning module parameters respectively corresponding to at least one of the digital twin features;

receive a user's configuration through a user interface, the user's configuration comprising an assignment of some of the tuning module parameters to a group of fixed tuning module parameters and an assignment of others of the tuning module parameters to a group of free tuning module parameters;

determine tuning module parameters for the free tuning module parameters; and generate a digital twin by selecting, configuring, and combining digital-twin-modules of the digital twin modular system based at least in part on the tuning module parameters and user's configuration to increase adaptability of the digital twin in different environments.

\* \* \* \* \*